Aug. 30, 1966 E. DENT 3,269,873

THERMOELECTRIC GENERATOR ASSEMBLY

Filed Aug. 29, 1962 2 Sheets-Sheet 1

INVENTOR.
Eugene Dent
BY
Paul J. Ethington
ATTORNEY

Aug. 30, 1966 E. DENT 3,269,873

THERMOELECTRIC GENERATOR ASSEMBLY

Filed Aug. 29, 1962 2 Sheets-Sheet 2

INVENTOR.
Eugene Dent

BY

Paul J. Ethington
ATTORNEY

United States Patent Office 3,269,873
Patented August 30, 1966

3,269,873
THERMOELECTRIC GENERATOR ASSEMBLY

Eugene Dent, Indianapolis, Ind., assignor to General Motors Corporation, Detroit, Mich., a corporation of Delaware Filed Aug. 29, 1962, Ser. No. 220,258
6 Claims. (Cl. 136—208)

This invention relates to thermoelectric generators and more particularly to means for supporting thermoelectric elements and maintaining the elements in thermal contact with a firewall surrounding a heat source.

Thermoelectric generators are well known in the prior art and generally include a heat source surrounded by a firewall. A plurality of thermoelectric elements are each mounted with one end in thermal contact with the firewall so as to obtain hot junctions or heat absorbing terminals. Cooling means are provided for cooling the other end of each thermoelectric element to obtain cold junctions or heat transfer terminals. Circuit means are connected across the junctions of each element for obtaining electrical energy therefrom. One problem encountered in such generators arises from the inherent fragileness of the thermoelectric elements requiring that they be supported by external means. The supporting means should be designed to minimize stress forces which may be imparted to the elements due to temperature gradients existing between the firewall and the supporting means. Also, for maximum efficiency in the operation of such generators it is desirable that good thermal contact be maintained between the heat absorbing terminals of the thermoelectric elements and the firewall.

In accordance with this invention means are provided for supporting a thermoelectric element and maintaining the element in good thermal contact with a firewall surrounding a heat source. A hollow support member of flexible material is provided and is adapted to contain the firewall and the heat source. The flexible support member has an opening in the walls thereof exposing a portion of the firewall. A thermoelectric element is provided having heat transfer and heat absorbing terminals. The element is mounted to the flexible support member at the opening therein whereby the element is directed inwardly through the opening so that its heat absorbing terminal thermally engages the exposed portion of the firewall. Electrical means are connected with each terminal of the element for obtaining electrical energy therefrom. A retaining member may also be provided in compressive engagement with the element about at least a portion of the flexible support member so as to urge the element inwardly against the firewall to thereby maintain thermal contact therebetween.

A more complete understanding of this invention may be had from the detailed description which follows taken with the accompanying drawings in which.

Figure 1:
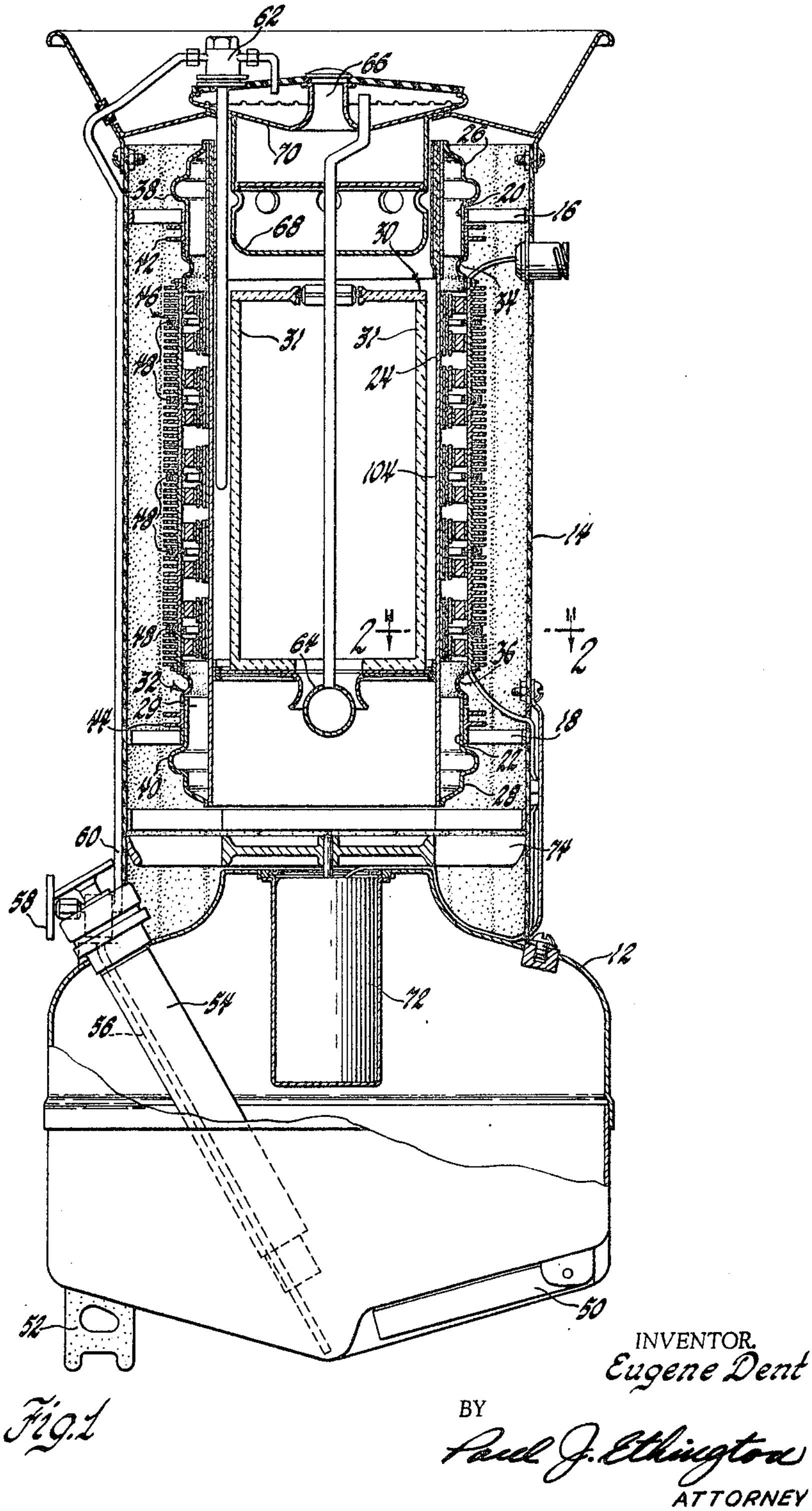
FIGURE 1 is an elevational view partly in section of a thermoelectric generator embodying the invention.

Referring now to the drawings and more particularly to FIGURE 1 there is shown a thermoelectric generator comprising a fuel tank 12 having mounted thereon a sixteen sided fiberglass air shroud 14. The shroud 14 has mounted therein support members 16 and 18 having formed therein circular apertures 20 and 22, respectively. A cylindrically shaped stainless steel firewall 24 having annular stainless steel flange members 26 and 28 suitably secured thereto at each end is mounted to the support members 16 and 18 in the apertures 22 and 20, respectively. A cylindrically shaped flexible panel support 32, more clearly shown in FIGURE 5 and described hereinafter in greater detail, surrounds the firewall 24 and is hermetically sealed at each end to the flange members 26 and 28, respectively, forming a cavity 29 between the firewall 24 and the panel support 32. Thermoelectric panel assemblies 46, also described hereinafter in greater detail, are mounted on the panel support 32 about the circumference of the firewall 24. The flange members 26 and 28 have annular expansion loops 38 and 40 formed therein for purposes of compensating for thermal expansion of the firewall 24. In addition, the flanges 26 and 28 have a plurality of transverse fins 42 and 44 respectively formed thereon for minimizing thermal expansion of the flanges. Five uniformly spaced non-conductive annular shape resilient bands 48 are provided in compressive engagement with the panel assemblies 46 about the circumference of the composite structure formed for purposes of obtaining inwardly directed forces acting to resiliently support the assemblies 46 on the panel support 32.

The fuel tank 12 has pivotally hinged to its bottom portion three folding legs 50 which are spaced 120° apart and three rubber feet 52 which are displaced 60° from the folding legs 50 for setting the generator on the ground. An air pump 54 and a fuel fill port 56 are mounted in a manner to protrude into the tank 12. A fuel control valve 58 is mounted on the tank and permits flow of fuel through a conduit 60 to a temperature control valve 62. A burner assembly 30 is suitably mounted within the firewall and includes hot porous catalyst bearing surfaces 31, a fuel orifice 64, a pre-heater fuel port 66, a preheater 68, and a vaporizer 70. A fan motor 72 is mounted within the fuel tank 12 and a fan blade 74 is connected therewith for imparting air flow within the air shroud 14 to cool the panel assemblies 46.

During the operation of the burner assembly 30, liquid fuel from the tank 12 is vaporized by convected heat from the burner and mixed with air aspirated from the surrounding atmosphere by the vapor fuel flow. The gaseous fuel air mixture is then diffused through the hot porous catalyst bearing surfaces 31 where the reaction occurs. By this method an efficient oxidation and energy release process is made to occur over a large area, and in intimate contact with the catalyst bearing surfaces 31. The heat transferred to the thermoelectric elements is principally by radiation from the burner assembly 30.

Figures 2, 3, 4, 5:
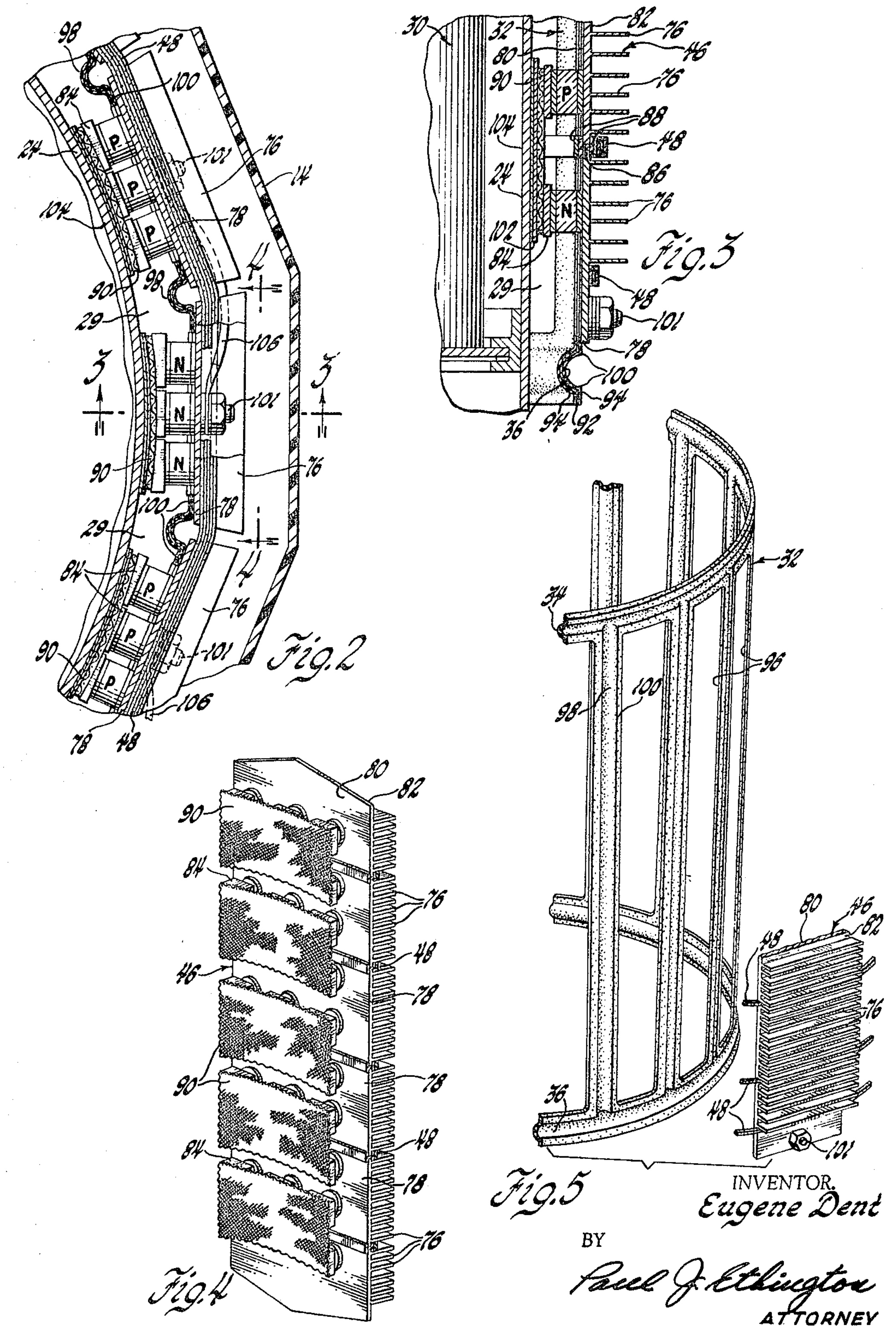
FIGURE 2 is a cross sectional view taken along line 2—2 in FIGURE 1 looking in the direction of the arrows.
FIGURE 3 is a cross sectional view taken along line 3—3 in FIGURE 2 looking in the direction of the arows.
FIGURE 4 is a perspective view of a panel member embodying the invention.
FIGURE 5 is a perspective view of a support member and a portion of a panel member embodying the invention.

The construction of the thermoelectric panel assemblies 46 may be more readily understood from reference to FIGURES 2, 3, 4 and 5. As shown in FIGURE 4, each panel assembly 46 comprises six rectangularly shaped aluminum platforms 78. Each platform 78 has a couple side 80 and a fin side 82. The fin side 82 of each platform 78 has formed thereon a plurality of transverse fins 76. Adjacent platforms 78 are insulated from each other and bonded together with a layer of epoxy support film 86, as shown in FIGURE 3, at their adjacent mating surfaces whereby the platforms 78 are aligned in the same plane with the fin sides 82 on the same side of the rectangularly shaped composite structure formed and the fins 76 are in parallel relationship with each other. A thin strip of aluminum 88 is bonded to the film 86 on each side of the platforms 78, as shown in FIGURE 3, so as to straddle the joint between adjacent platforms 78 and provide structural rigidity between adjacent platforms 78 without being in actual electrical contact therewith.

Three N-type lead telluride thermoelectric elements are each bonded at one end thereof to the couple side 80 of the platform 78 at one end of each panel assembly 46.

Similarly, three P-type lead telluride thermoelectric elements are each bonded at one end thereof to the couple side 80 of the platform 78 at the other end of each panel assembly 46. Three N-type and three P-type lead telluride thermoelectric elements are each bonded at one end thereof to the couple side 80 of each of the remaining platforms 78 of each panel assembly 46 whereby dissimilar thermoelectric elements are located adjacent each other across the support film 86 between adjacent platforms 78. The junction between each thermoelectric element and the platform 78 to which it is bonded provides a cold junction or heat transfer terminal for the element. The other end of each thermoelectric element has bonded thereto a copper shoe 84 having one face thereof beveled, as shown in FIGURE 2, to match the contour of the firewall 24. The shoe 84 provides a hot junction or heat absorbing terminal for the element. A flexible rectangular shaped copper mesh coupling member 90 is bonded to the beveled faces of the shoes 84 on the similar thermoelectric elements on each platform 78 and on the dissimilar thermoelectric elements on adjacent platforms 78 whereby the similar elements on each platform 78 are connected together in parallel and the dissimilar elements are connected together in series. A terminal stud 101 is mounted to the platform 78 at each end of each panel assembly 46 so as to permit electrical energy to be obtained from the cold junctions of the thermoelectric elements.

The construction of the panel support 32 will be more readily understood from reference to FIGURES 3 and 5. The panel support 32 is fabricated from a high temperature laminate comprising a sheet of fiberglass 92 bonded between two layers of rubber 94 forming a flexible cylindrical structure. The panel support 32 has sixteen rectangularly shaped openings 96 in the wall thereof about its circumference. The panel support 32 is embossed whereby a recess 98 is formed in the outside wall thereof around the periphery of each opening 96 so as to form annular expansion loops 34 and 36 about opposing ends of the panel support 32. In addition, the recess 98 forms a shoulder 100 about the periphery of each opening 96. The size of each opening 96 in the panel support 32 is such that the contour and the area of each opening plus its surrounding shoulder 100 corresponds with the contour and area, respectively, of each panel assembly 46.

In assembly as shown in FIGURES 1, 2 and 3, each panel assembly 46 is hermetically sealed at its couple side 80 to the panel support 32 on the shoulder 100 surrounding the periphery of a different one of the openings 96. The panel assemblies 46 seat on the shoulder 100 whereby adjacent panel assemblies are not in electrical contact with each other and the ends of the panel assemblies 46 do not extend beyond the expansion loops 34 and 36. The thermoelectric elements are directed inwardly through the openings 96 into the cavity 29 so that the coupling members 90 thermally engage the firewall 24. The firewall 24 is coated with a layer of aluminum oxide 102 where it is in contact with the coupling members 90 so as to thereby insulate the coupling members 90 from each other. The five uniformly spaced annular shaped compression bands 48 are constructed of fiberglass and each circumferentially surrounds the panel support 32 outwardly of and in engagement with the panel assemblies 46. The bands 48 are maintained in a stressed condition whereby each band exerts inwardly directed forces against the panel assemblies 46 to thereby resiliently maintain the heat absorbing terminal of each thermoelectric element in thermal contact with the firewall 24. In addition, electrical connector straps 106 are suitably connected with the terminal stud 101 at each end of each panel assembly 46 with one of the terminal studs 101 at one end of a different one of the adjacent panel assemblies 46 so as to electrically connect the panel assemblies 46 in series.

Since thermoelectric elements of the lead telluride type may be damaged and their thermal efficiency decreased if used in an oxidizing atmosphere, it is desirable that the cavity 29 between the firewall 24 and the panel assemblies 46 to be evacuated during the assembly of the thermoelectric generator. The evacuation of the cavity 29 also permits proper tensioning of the compression bands 48. Furthermore, the couple side 80 of each platform 78 and the outside wall of the firewall 24 where it is not coated with aluminum oxide 102 are highly polished so as to minimize radiation losses from the cavity 29. In addition, for increased thermal efficiency of the generator, the inside wall of the firewall 24 is coated with a suitable black body 104.

During the operation of the thermoelectric generator the stainless steel firewall 24 will expand and contract axially and radially of its axis of symmetry with increases and decreases, respectively, in temperature of the burner assembly 30. However, the aluminum platforms 78 are maintained at a considerably lower temperature than the firewall 24 due to the cooling effect of air circulating among the fins 76 caused by the motor fan blades 74 and the large surface area of the fins 76 which facilitates dissipation of heat from the platforms 78. Thus, expansion and contraction of the platforms 78 will be less than that of the firewall 24. The difference in axial expansion and contraction of the firewall and that of the platforms 78 is compensated for by the expansion loops 34 and 36 in the panel support 32 and the expansion loops 38 and 40 in the flange members 26 and 28, respectively. Furthermore, expansion of the flange members 26 and 28 is minimized due to the cooling effect obtained from the fins 42 and 44 on the flange members 26 and 28, respectively. Thus by compensating for differences in expansion and contraction of the platforms 78 and the firewall 24 with variations in temperature of the burner assembly 30, thermal contact between the firewall 24 and the heat absorbing terminal of each thermoelectric element will be maintained.

Although the description of this invention has been given with respect to a particular embodiment, it is not to be construed in a limiting sense. Numerous variations and modifications within the spirit and scope of the invention will now occur to those skilled in the art. For a definition of the invention, reference is made to the appended claims.

I claim:

1. In combination with a thermoelectric generator of the type including a heat source surrounded by a firewall, means for supporting and maintaining a thermoelectric element in thermal contact with the firewall, the means including a hollow flexible support member which surrounds the heat source and firewall, the flexible support member having an opening therein exposing a portion of the firewall, a thermoelectric element having a heat transfer terminal and a heat absorbing terminal, a mesh member mounted in thermal contact with a heat absorbing terminal, a heat sink mounted in thermal contact with the heat transfer terminal, the heat sink being mounted on the flexible support member at the opening therein whereby the thermoelectric element is directed inwardly through the opening so that the mesh member on the heat absorbing terminal thermally engages the exposed portion of the firewall, electrical means connected with each terminal of the thermoelectric element for obtaining electrical energy therefrom, and an insulating retaining band in compressive engagement with the heat sink of the thermoelectric element about at least a portion of the flexible support member so as to urge the thermoelectric element inwardly toward the firewall to thereby maintain thermal contact therebetween.

2. In combination with a thermoelectric generator of the type including a heat source surrounded by a firewall, means for supporting and maintaining a thermoelectric element in thermal contact with the firewall, the means including a hollow non-conductive flexible support member which surrounds the heat source and the firewall, the non-conductive support member having an opening therein exposing a portion of the firewall, a conductive support member, a thermoelectric element mounted at one end thereof on the conductive support member so as to form a heat transfer junction therewith, a mesh member mounted in thermal contact with the other end of the element, the conductive support member being mounted on the non-conductive support member at the opening therein whereby the thermoelectric element is directed inwardly through the opening so that the mesh member on the other end of the element thermally engages the exposed portion of the firewall by means of the mesh member forming a heat absorbing terminal therewith, electrical terminal means connected with each end of the element for obtaining electrical energy therefrom, and an annular insulating retaining member in compressive engagement with the conductive support member about the flexible support member so as to urge the thermoelectric element inwardly against the firewall to thereby maintain thermal contact therebetween.

3. In combination with a thermoelectric generator of the type including a heat source surrounded by a firewall, means for supporting and maintaining thermoelectric elements in thermal contact with the firewall, the means including a hollow non-conductive flexible support member which contains the heat source and the firewall, the non-conductive support member having an opening therein exposing a portion of the firewall, a panel member comprising a pair of conductive platforms, bonding means of insulating material connecting the platforms together, a first thermoelectric element mounted at one end to one platform and a second thermoelectric element which is dissimilar from the first element mounted at one end to the other platform, electrical coupling means connecting the other ends of the elements together, the panel member being mounted on the non-conductive support member at the opening therein whereby the thermoelectric elements are directed inwardly through the opening so that the electrically coupled ends of the elements thermally engage the exposed portion of the firewall, electrical terminal means connected with each platform for obtaining electrical energy from the thermoelectric elements, and a retaining member in compressive engagement with the panel member about the flexible support member so as to urge the thermoelectric elements inwardly against the firewall to thereby maintain thermal contact therebetween.

4. In combination with a thermoelectric generator of the type including a heat source surrounded by a firewall, means for supporting thermoelectric elements in thermal contact with the firewall, the means including a hollow non-conductive support member which contains the heat source and the firewall, the non-conductive support member having a plurality of openings therein each exposing a portion of the firewall, a plurality of panel members, each panel member comprising three conductive platforms, each platform having first and second sides, bonding means of insulating material connecting the platforms together so that the first sides are all on the same side of the composite structure formed, a first plurality of similar thermoelectric elements and a second plurality of similar thermoelectric elements which are dissimilar from the elements of the first plurality of elements, an element from the first plurality of elements mounted at one end thereof to the first side of the platform at one end of the three interconnected platforms, an element from the second plurality of elements mounted at one end thereof to the first side of the platform at the other end of the three interconnected platforms, an element from each of the first and second plurality of elements mounted at one end thereof to the first side of the third platform of the three interconnected platforms, electrical coupling means connecting the other ends of the dissimilar elements on adjacent platforms whereby the dissimilar elements are connected together in series, each panel member being mounted on the non-conductive support member at a different one of the openings therein so as to be insulated from each other and whereby the thermoelectric elements are directed inwardly through the openings so that the electrically coupled ends of the elements thermally engage the exposed portions of the firewall, and electrical terminal means connected with the platform at each end of the three interconnected platforms of each panel member for obtaining electrical energy from the thermoelectric elements.

5. In combination with a thermoelectric generator of the type including a heat source surrounded by a cylindrically shaped firewall, means for supporting thermoelectric elements in thermal contact with the firewall, the means including a hollow cylindrically shaped non-conductive support member constructed of flexible material and adapted to contain the heat source and the firewall, the firewall having an annular flange formed at each end thereof, the support member having a plurality of openings in the wall thereof, the support member having an annular recess formed in the outside wall thereof about each end, the support member coaxially surrounding the firewall and hermetically sealed at each end to a different one of the annular flanges of the firewall so as to form a cavity between the firewall and the support member, a plurality of panel members, each panel member comprising a plurality of conductive platforms, each platform having first and second sides, bonding means of insulating material connecting the platforms together so that the first sides are all on the same side of the composite structure formed, structure means of mechanically rigid material associated with the bonding means for providing structural support for adjacent platforms, a first plurality of similar thermoelectric elements and a second plurality of similar thermoelectric elements which are dissimilar from the elements of the first plurality of elements, a plurality of elements from the first plurality of elements being each mounted at one end thereof to the first side of the platform at one end of the plurality of platforms, a plurality of elements from the second plurality of elements being each mounted at one end thereof to the first side of the platform at the other end of the plurality of platforms, a plurality of elements from each of the first and second plurality of elements being each mounted at one end thereof to the first sides of the other platforms of the plurality of platforms, electrical coupling means connecting the other ends of the similar elements on each platform and the dissimilar elements on adjacent platforms whereby the similar elements on each platform are connected together in parallel and the dissimilar elements are connected together in series, electrical terminal means connected with the platform at each end of the plurality of platforms for obtaining electrical energy from the thermoelectric elements, each panel member being hermetically sealed to the support member at a different one of the openings therein so as to be insulated from each other and whereby the thermoelectric elements are directed inwardly through the openings into the cavity so that the electrically coupled ends of the elements thermally engage the exposed portions of the firewall, the first sides of the platform being polished so as to minimize radiation losses from the cavity, the flange at each end of the firewall having an annular expansion loop formed therein whereby the expansion loops and the annular recess at each end of the flexible support member coact together to compensate for expansion of the firewall axially of its axis of symmetry due to variations in temperature of the heat source so as to permit maintenance of thermal contact between the firewall and the electrically coupled ends of the thermoelectric elements with variations in temperature of the heat source, and electrical means connected with the terminal means at each end of each panel member with one of the terminal means at one end of a different one of the adjacent panel members so as to electrically connect the panel members in series.

6. In combination with a thermoelectric generator of the type including a heat source surrounded by a cylindrically shaped firewall, means for supporting and maintaining thermoelectric elements in thermal contact with the firewall, the means including a hollow cylindrically shaped non-conductive support member constructed of flexible material and adapted to contain the heat source and the firewall, the firewall having an annular flange formed at each end thereof, the support member having a plurality of openings in the wall thereof, the support member having a recess formed in the outside wall thereof of annularly about each end and about the periphery of each opening in the wall between adjacent openings, the support member coaxially surrounding the firewall and hermetically sealed at each end to a different one of the annular flanges of the firewall so as to form a cavity between the firewall and the support member, a plurality of panel members, each panel member comprising a plurality of conductive platforms, each platform having first and second sides, bonding means of insulating material connecting the platforms together so that the first sides are all on the same side of the composite structure formed, structure means of mechanically rigid material associated with the bonding means for providing structural support for adjacent platforms, a first plurality of similar thermoelectric elements and a second plurality of similar thermoelectric elements which are dissimilar from the elements of the first plurality of elements, a plurality of elements from the first plurality of elements being each mounted at one end thereof to the first side of the platform at one end of the plurality of platforms, a plurality of elements from the second plurality of elements being each mounted at one end thereof to the first side of the platform at the other end of the plurality of platforms, a plurality of elements from each of the first and second plurality of elements being each mounted at one end thereof to the first sides of the other platforms of the plurality of platforms, electrical coupling means connecting the other ends of the similar elements on each platform and the dissimilar elements on adjacent platforms whereby the similar elements on each platform are connected together in parallel and the dissimilar elements are connected together in series, electrical terminal means connected with the platform at each end of the plurality of platforms for obtaining electrical energy from the thermoelectric elements, each panel member being hermetically sealed to the support member at a different one of the openings therein so as to be insulated from each other and whereby the thermoelectric elements are directed inwardly through the openings into the cavity so that the electrically coupled ends of the elements thermally engage the exposed portions of the firewall, the recess in the outside wall of the support member about the periphery of each opening providing resilient support of the panel member hermetically sealed to the support member at the opening, the first sides of the platform being polished so as to minimize radiation losses from the cavity, a plurality of fins formed on the second side of each platform for facilitating dissipation of heat from the platforms, the flange at each end of the firewall having an annular expansion loop formed therein whereby the expansion loops and the annular recess at each end of the flexible support member coact together to compensate for expansion of the firewall axially of its axis of symmetry due to variations in temperature of the heat source so as to permit maintenance of thermal contact between the firewall and the electrically coupled ends of the thermoelectric elements with variations in temperature of the heat source, an annular resilient band surrounding the flexible support member outwardly of and in engagement with the panel members so that the band is in stressed condition whereby the band exerts inwardly directed forces against the panel members to resiliently maintain the electrically coupled ends of the thermoelectric elements in thermal contact with the firewall, and electrical means connected with the terminal means at each end of each panel member with one of the terminal means at one end of a different one of the adjacent panel members so as to electrically connect the panel members in series.

References Cited by the Examiner

UNITED STATES PATENTS

| | | | |
|---|---|---|---|
| 2,698,291 | 12/1954 | Andrus | 136—4 X |
| 3,129,116 | 4/1964 | Corry | 136—4 |

WINSTON A. DOUGLAS, *Primary Examiner.*

ALLEN B. CURTIS, *Examiner.*